United States Patent
Gupta

(12)
(10) Patent No.: US 6,483,344 B2
(45) Date of Patent: Nov. 19, 2002

(54) INTERCONNECT CIRCUITRY FOR IMPLEMENTING LOGIC FUNCTIONS IN A FIELD PROGRAMMABLE GATE ARRAY AND METHOD OF OPERATION

(75) Inventor: Vidyabhusan Gupta, Palo Alto, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/773,320

(22) Filed: Jan. 31, 2001

(65) Prior Publication Data

US 2002/0101259 A1 Aug. 1, 2002

(51) Int. Cl.[7] .............................................. H01L 25/00
(52) U.S. Cl. ............................. 326/41; 326/38; 326/47; 326/39
(58) Field of Search ........................ 326/38, 39, 41–45, 326/47

(56) References Cited

U.S. PATENT DOCUMENTS 5,936,424 A * 8/1999 Young et al. .................. 326/39
6,016,063 A * 1/2000 Trimberger .................. 326/81

* cited by examiner

Primary Examiner—Michael Tokar
Assistant Examiner—Anh Q Tran
(74) Attorney, Agent, or Firm—Lisa K. Jorgenson; William A. Munck

(57) ABSTRACT

There is disclosed a field programmable gate array that performs in the interconnect matrix selected Boolean logic functions, such as OR gates and NOR gates, normally performed in the configurable logic blocks of the FPGA. The field programmable gate array comprises: 1) a plurality of configurable logic blocks (CLBs); 2) a plurality of interconnects; 3) a plurality of interconnect switches for coupling ones of the plurality of interconnects to each other and to inputs and outputs of the plurality of configurable logic blocks; and 4) an interconnect switch controller for controlling the plurality of interconnect switches. The interconnect switch controller in a first switch configuration causes a first interconnect to be coupled to an output of a first CLB, causes a second interconnect to be coupled to an output of a second CLB, causes the first and second interconnects to be coupled to a third interconnect, and causes the third interconnect to be coupled to a pull-up device coupled to a power supply source of the field programmable gate array. The first, second and third interconnects and the pull-up device thereby form a two-input OR gate.

51 Claims, 3 Drawing Sheets

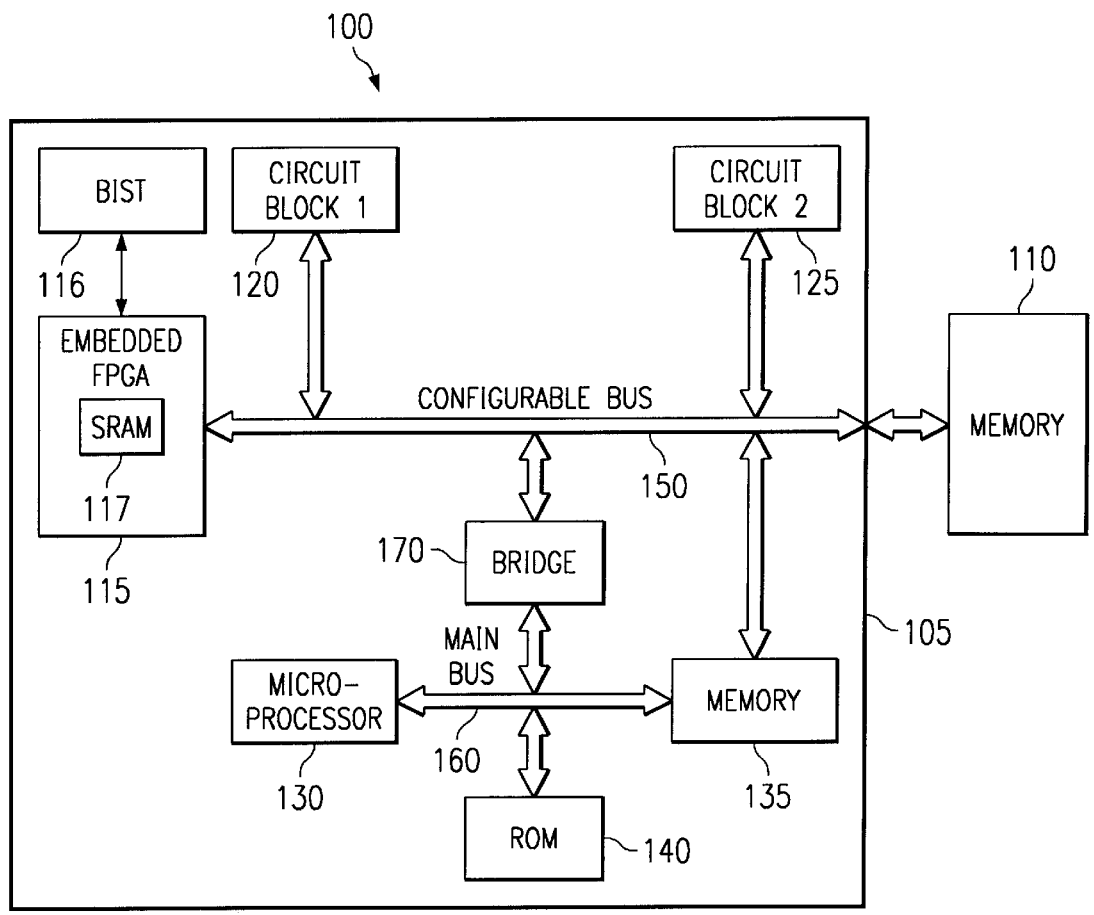
FIG. 1
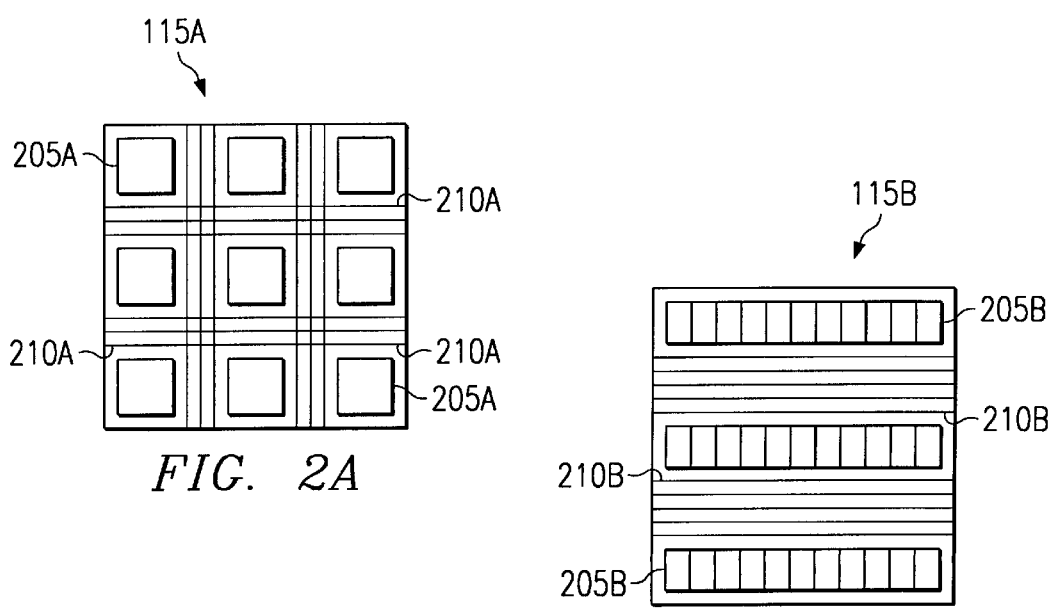
FIG. 2A
FIG. 2B

INTERCONNECT CIRCUITRY FOR IMPLEMENTING LOGIC FUNCTIONS IN A FIELD PROGRAMMABLE GATE ARRAY AND METHOD OF OPERATION

CROSS-REFERENCE TO RELATED APPLICATION

The present invention is related to that disclosed in U.S. patent application Ser. No. 09/774,891 filed concurrently herewith, entitled "INTERCONNECT CIRCUITRY FOR IMPLEMENTING BIT-SWAP FUNCTIONS IN A FIELD PROGRAMMABLE GATE ARRAY AND METHOD OF OPERATION". Patent application Ser. No. 09/774,891 is commonly assigned to the assignee of the present invention. The disclosure of this related patent application is hereby incorporated by reference for all purposes as if fully set forth herein.

TECHNICAL FIELD OF THE INVENTION

The present invention is generally directed to field programmable gate array (FPGA) circuits, a more specifically to an FPGA circuit in which logic functions may be implemented by the interconnect circuitry between logic blocks.

BACKGROUND OF THE INVENTION

The speed, power, and complexity of integrated circuits, such as microprocessor chips, random access memory (RAM) chips, application specific integrated circuit (ASIC) chips, and the like, have increased dramatically in the last twenty years. More recently, these increases have led to development of so-called system-on-a-chip (SoC) devices. A SoC device allows nearly all of the components of a complex system, such as a cell phone or a television receiver, to be integrated onto a single piece of silicon. This level of integration greatly reduces the size and power consumption of the system, while generally also reducing manufacturing costs.

A key component in many highly integrated circuits, including SoC devices, is the field programmable gate array (FPGA). FPGA circuits are a particular class of general purpose integrated circuits (ICs) that can be configured (i.e., programmed) to perform a wide range of tasks. There are a number of different types of FPGA circuit topologies, including symmetrical array, row-based, sea-of-gates, and hierarchical programmable logic device (PLD). Each of these FPGA types has certain advantages over other types, depending on the specific application.

FPGA circuits generally are implemented using one of four technologies: static RAM cells, anti-fuse, EPROM transistors, and EEPROM transistors. In static RAM technology, programmable connections in the FPGA are made using pass transistors, transmission gates, or multiplexers controlled by a static random access memory (RAM) cell. Static RAM cells technology allow fast reconfiguration of a FPGA circuit. Anti-fuse technology uses an anti-fuse that is initially a high-impedance connection path (i.e., open circuit). The anti-fuse is then programmed into a low impedance (i.e., short circuit) or fused state. While anti-fuse technology is simple and less expensive than static RAM technology, an anti-fuse is a "program once" device. EPROM and EEPROM technologies use the same methods that are used in EPROM memories.

There are three primary configurable elements in a FPGA circuit: configurable logic blocks (CLBs), input/output (I/O) blocks, and programmable interconnects. The configurable logic blocks contain a variety of different logic functions, such as look-up tables (LUTs), registers, multiplexer (MUX) gates, programmable logic arrays (PLDs) programmable logic devices (PLDs), and the like. A programmable interconnect generally connects a single output of a CLB to an input of another CLB. An interconnect comprises metal wires and transistors that act as pass gates and signal buffers that preserve the signal integrity. Control of the interconnect transistors may be provided by an SRAM cell, a flash RAM cell, or external pins. The programming of an interconnect is usually done in a static fashion, such as at the power-up of a stand-alone FPGA circuit, especially for flash RAM and SRAM based configurations. The I/O blocks provide the interface between the external pins of the IC package and the internal signals lines, including the programmable interconnects.

Despite the considerable advancements made in field programmable gate array circuits, however, there remains room for improvement. There is a limitation to the complexity of the logic functions that may be implemented in a FPGA circuit of a particular size and density. More complex functions call for still greater FPGA density. However, this greater density must be achieved without incurring larger latencies due to increased propagation times through the FPGA circuit.

Therefore, there is a need in the art for system-on-a-chip (SoC) devices and other large scale integrated circuits that implement improved field programmable gate array (FPGA) circuits. In particular, there is a need for FPGA circuits, including embedded FPGA circuits, that achieve greater density and/or utilization over standard FPGA technologies. More particularly, there is a need for improved FPGA circuits that are capable of performing more complex logical functions while minimizing propagation times.

SUMMARY OF THE INVENTION

To address the above-discussed deficiencies of the prior art, it is a primary object of the present invention to provide a field programmable gate array capable of performing in the interconnect matrix selected Boolean logic functions, such as OR gates and NOR gates, that are normally performed in the configurable logic blocks of the FPGA. According to an advantageous embodiment of the present invention, the field programmable gate array comprises: 1) a plurality of configurable logic blocks (CLBs); 2) a plurality of interconnects; 3) a plurality of interconnect switches capable of coupling ones of the plurality of interconnects to each other and to inputs and outputs of the plurality of configurable logic blocks; and 4) an interconnect switch controller capable of controlling the plurality of interconnect switches. The interconnect switch controller in a first switch configuration causes a first interconnect to be coupled to an output of a first CLB, causes a second interconnect to be coupled to an output of a second CLB, causes the first and second interconnects to be coupled to a third interconnect, and causes the third interconnect to be coupled to a pull-up device coupled to a power supply source of the field programmable gate array. The first, second and third interconnects and the pull-up device thereby form a two-input NOR gate.

According to one embodiment of the present invention, the interconnect switch controller comprises a memory capable of storing the first switch configuration.

According to another embodiment of the present invention, the memory comprises a static read only memory.

According to still another embodiment of the present invention, the interconnect switch controller comprises at least one configurable logic block in the field programmable gate array.

According to yet another embodiment of the present invention, the pull-up device is a pull-up transistor.

According to a further embodiment of the present invention, the field programmable gate array further comprises a buffer having an input coupled to the third interconnect and an output coupled to an input of a third CLB.

According to a still further embodiment of the present invention, the buffer is a non-inverting line driver.

According to a yet further embodiment of the present invention, the buffer is an inverting line driver, such that the first, second and third interconnects, the pull-up device, and the buffer thereby form a two-input OR gate.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIG. 1 illustrates a processing system that includes an exemplary system-on-a-chip (SoC) device according to one embodiment of the present invention;

FIGS. 2A–2D illustrate various circuit topologies of the field programmable gate array (FPGA) in the exemplary SoC device in FIG. 1;

DETAILED DESCRIPTION OF THE INVENTION

Figure 2C:
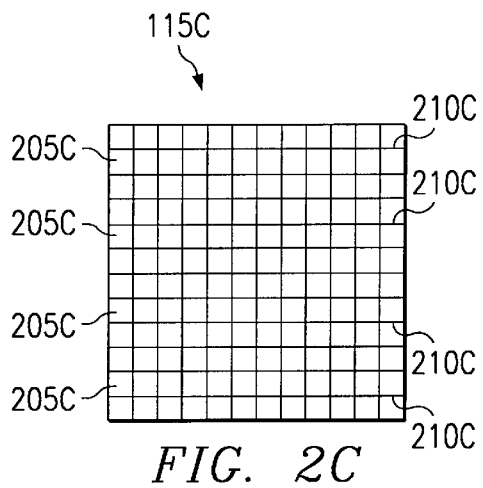

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged field programmable gate array (FPGA).

FIG. 1 illustrates processing system 100, which includes exemplary system-on-a-chip (SoC) device 105 according to one embodiment of the present invention. SoC device 105 is a single integrated circuit comprising embedded field programmable gate array (FPGA) 115, optional FPGA built-in self test (BIST) circuit 116, peripheral circuits 120 and 125, microprocessor 130, random access memory (RAM) 135, read-only memory (ROM) 140, configurable bus 150, main (or system) bus 160, and bridge circuit 150. In an exemplary embodiment of the present invention, processing system 100 also comprises external memory 110, which may be, for example, a flash memory, a random access memory, a disc storage device, or the like. Optional FPGA built-in self test (BIST) circuit 116 is used to perform BIST testing on embedded FPGA device 115 in the event of a reboot or other event that requires the execution of BIST functions.

Processing system 100 is shown in a general level of detail because it is intended to represent any one of a wide variety of electronic devices, particularly consumer appliances. For example, processing system 100 may be a printer rendering system for use in a conventional laser printer. Processing system 100 also may represent selected portions of the video and audio compression-decompression circuitry of a video playback system, such as a video cassette recorder or a digital versatile disk (DVD) player. In another alternative embodiment, processing system 100 may comprise selected portions of a cable television set-top box or a stereo receiver.

Embedded FPGA 115 and peripheral circuits 120 and 125, which are arbitrarily labeled Circuit Block 1 and Circuit Block 2, respectively, may be configured to implement any designated function in processing system 100. For example, peripheral circuit 120 may be a video codec and peripheral circuit 125 may be an audio code. In the ordinary operation of processing system 100, embedded FPGA 115 also may be a video codec, and audio coded, or some other functional unit, such as a bus controller for configurable bus 150.

In an exemplary embodiment of the present invention, microprocessor 130 executes an application program that may be stored in RAM 135. ROM 140 stores a start-up program that is executed by microprocessor 130 after a system reboot. Address and data information is transferred between microprocessor 130, RAM 135 and ROM 140 via main bus 160. Similarly, address and data information may be transferred between peripheral devices 120 and 125 and embedded FPGA 115 via configurable bus 150. Data traffic may be transferred between configurable bus 160 and main bus 160 via bridge 170, which provides isolation between configurable bus 150 and main bus 160 to increase overall system throughput.

According to the principles of the present invention, embedded FPGA 115 comprises configuration static random access memory (SRAM) 117, configurable logic blocks (CLBs), input/output (I/O) blocks, and programmable interconnects. The configurable logic blocks contain a variety of different logic functions, such as look-up tables (LUTs), registers, multiplexer (MUX) gates, programmable logic arrays (PLDs), programmable logic devices (PLDs), and the like. However, the programmable interconnects in FPGA 115 differ from the interconnects of prior art FPGA circuits, which merely provide connections between the outputs of some CLBs and the inputs of other CLBs. The programmable interconnects in FPGA 115 are selectively connected under the control of configuration SRAM 117 (or designated CLBS) in order to implement selected logical operations, including Boolean operators (i.e., AND, NAND, OR, NOR, and similar functions).

FIGS. 2A–2D illustrate various circuit topologies of field programmable gate array (FPGA) 115 in exemplary SoC device 105. FIG. 2A illustrates FPGA 115A, which uses a symmetrical array topology. A symmetrical array topology comprises a plurality of configurable logic blocks (CLBs), such as exemplary CLB 205A, arranged in an N×M matrix and separated by vertical columns and horizontal rows of interconnects, such as exemplary interconnect 210A. The inputs and outputs of the CLBs are selectively connectable to the rows and columns of interconnects. FIG. 2B illustrates FPGA 115B, which uses a row-based topology. A row-based topology comprises a plurality of configurable logic blocks (CLBs), such as exemplary CLB 205B, arranged in a plurality of rows and separated by horizontal rows of interconnects, such as exemplary interconnect 210B. The inputs and outputs of the CLBs are selectively connectable to the rows of interconnects.

Figure 2D:
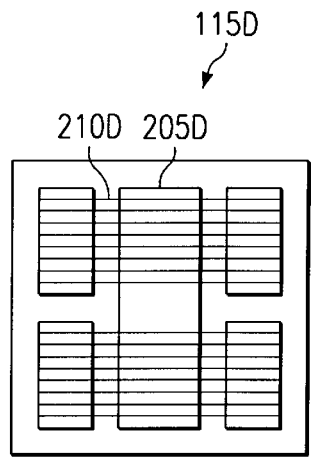

FIG. 2C illustrates FPGA 115C, which uses a sea-of-gates topology. A sea-of-gates topology comprises a plurality of comparatively simple logic gates, such as exemplary logic gate 205C, arranged in an R×C matrix and separated by vertical columns and horizontal rows of interconnects, such as exemplary interconnect 210C. The inputs and outputs of the logic gates are selectively connectable to the rows and columns of interconnects. FIG. 2D illustrates FPGA 115D, which uses a hierarchical programmable logic device (PLD) topology. A hierarchical programmable logic device topology comprises a plurality of programmable logic devices, such as exemplary PLD 205D, that are selectively connectable by a plurality of interconnects, such as exemplary interconnect 210D. An FPGA circuit having programmable interconnects that perform selected logical operations according to the principles of the present invention may be embodied as anyone of the foregoing circuit topologies, as well as other FPGA circuit topologies.

Figure 3A:
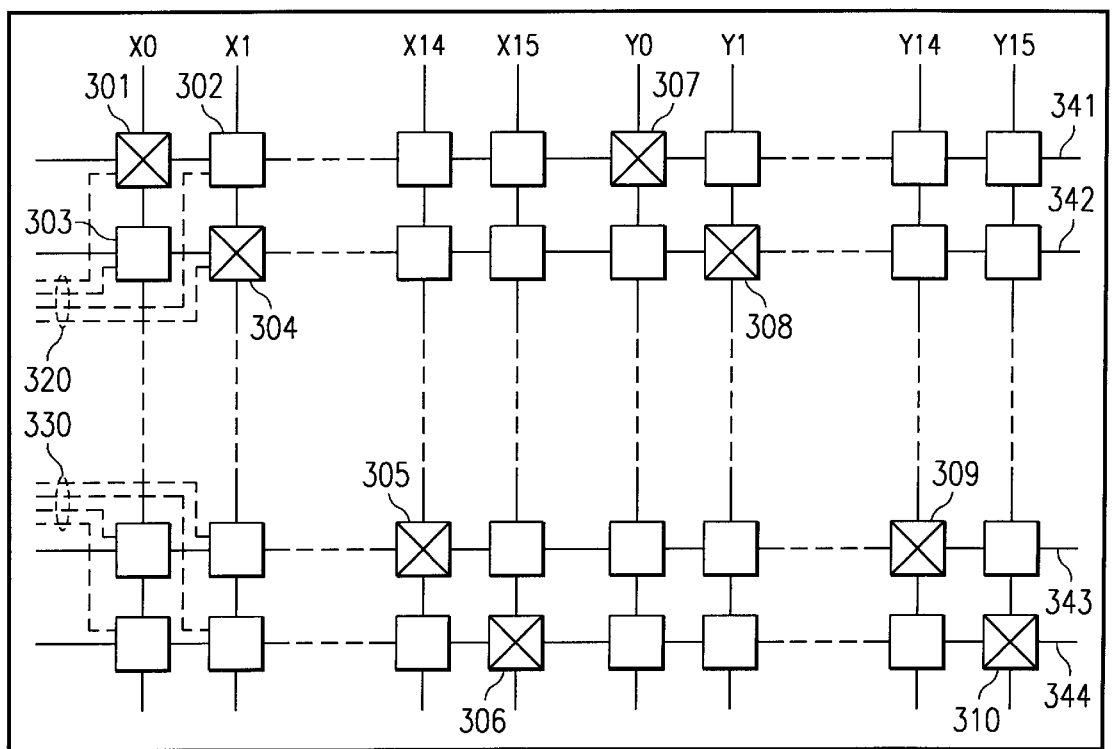
FIGS. 3A and 3B illustrate an exemplary bit swap device implemented with programmable interconnects that is operable to receive an N-bit input value and generate a re-ordered N-bit output value according to one embodiment of the present invention.
Figure 3B:
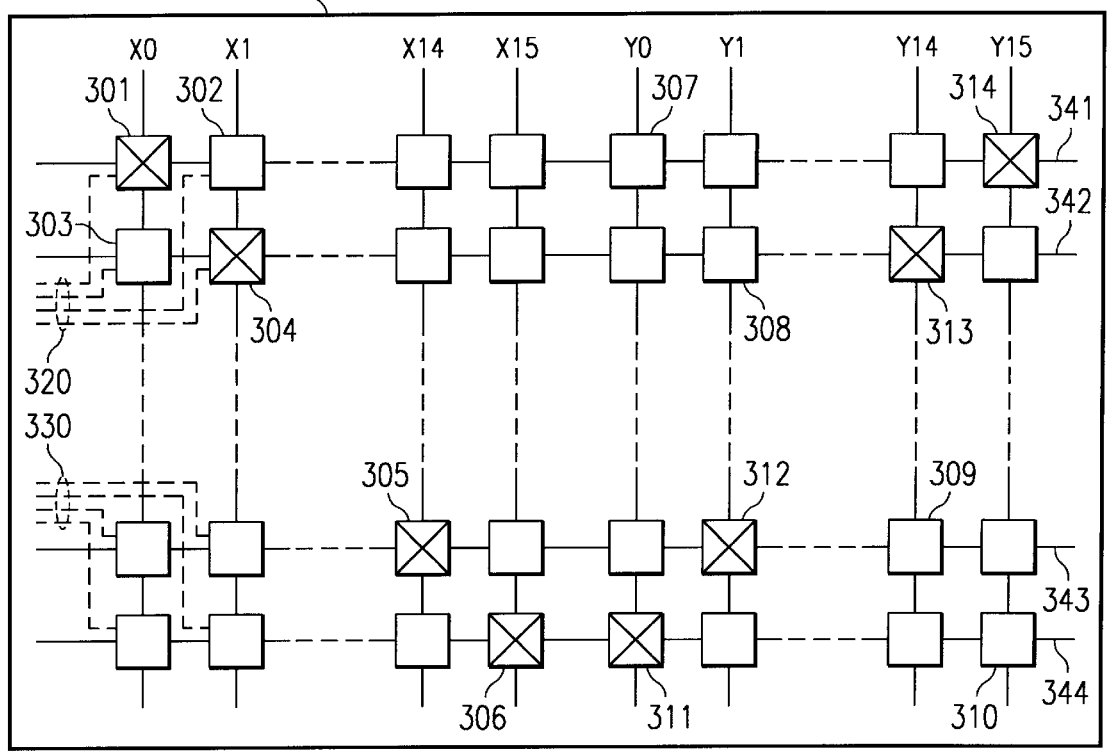

FIGS. 3A and 3B illustrate exemplary bit swap device 300 in FPGA 115 that uses programmable interconnects to receive an N-bit input value and generate a re-ordered N-bit output value according to one embodiment of the present invention. The bit swap operation can be described as follows. Given a N-bit value X, where each of the bits is described by the concatenation [X(N−1), X(N−2), . . . , X2, X1, X0] and an N-bit value Y, where each of the bits is described by the concatenation [Y(N−1), Y(N−2), . . . , Y2, X1, X0], the value Y can be related to the value X according to the following relationship:

$$Y(N-1)=X0, Y(N-2)=X1, \ldots Y2=X(N-3), Y1=X(N-2), Y0=X(N-1).$$

This operation is often performed when handling data that has different "endianess", thereby requiring the program to convert between little endian format (least significant bit or byte first) and big endian format (most significant bit or byte first). According to the principles of the present invention, the endian conversion operation may be executed by the programmable interconnects in FPGA 115, rather than in a configurable logic block, by reprogramming 2N switches between the interconnects. The 2N switches may be controlled by switch position settings stored in configuration SRAM 117 or by one or more configuration CLBs. This results in a bit swap operation that is carried out with very little circuit overhead and with a major reduction in circuit area. One key point is that the configuration bits of the routing array are able to be set by the logic inside of the FPGA itself.

In the exemplary circuit in FIG. 3A, it is assumed that the X value and the Y value have the same endian format (i.e., both big endian format or both little endian format). For the sake of simplicity in explaining the operation of the bit swap device, it is assumed that X and Y are 16-bit values. Thus, X0=Y0, X1=Y1, . . . , X15=Y15. The sixteen bits of the value X are coupled to programmable vertical interconnects that are labeled X0, X1, X2, . . . , X15 for convenience. The sixteen bits of the value Y are coupled to programmable vertical interconnects that are labeled Y0, Y1, Y2, . . . , Y15 for convenience.

Bit swap device 300 in FPGA 115 also comprises programmable horizontal interconnects, including exemplary programmable horizontal interconnects 341, 342, 343 and 344. Any one of the programmable vertical interconnects, X0, X1, . . . , X15 and Y0, Y1, . . . , Y15 may be selectively coupled to anyone of the programmable horizontal interconnects by closing interconnect switches, such as exemplary interconnect switches 301–310, disposed at the junctions of the vertical and horizontal interconnects. In FIGS. 3A and 3B, closed interconnect switches are shown as a square with an X therein and open interconnect switches are shown as an empty square. Thus, interconnect switch 301 and interconnect switches 304–310 are closed and interconnect switches 302 and 303, among others, are open.

As FIG. 3A shows, vertical interconnect X0 and vertical interconnect Y0 are both connected to horizontal interconnect 341. Similarly, vertical interconnect X1 and vertical interconnect Y1 are both connected to horizontal interconnect 342. This connection scheme continues through vertical interconnect X15 and vertical interconnect Y15, which are both connected to horizontal interconnect 344. In this manner, the X value and the Y value have the same endian format, such that X0=Y0, X1=Y1, . . . , X15=Y15. The interconnect switches are set by switch select lines that may be controlled by, for example, a static random access memory (SRAM). Groups of exemplary switch select lines (shown as dotted lines) are designated by reference numbers 320 and 330. The exemplary switch select lines designated by reference number 320 control exemplary interconnect switches 301–304.

However, the endian format can easily be reversed by selectively resetting the interconnect switches that couple the vertical interconnects and the horizontal interconnects. As FIG. 3B illustrates, the interconnect switches that couple the vertical interconnects Y0–Y15 to the horizontal interconnects have been reset to reverse the endian format. Thus, interconnect switch 307 is open and interconnect switch 311 is closed, so that vertical interconnect Y0 is now coupled to vertical interconnect X15, rather that to vertical interconnect X0. Similarly, interconnect switch 308 is open and interconnect switch 312 is closed, so that vertical interconnect Y1 is now coupled to vertical interconnect X14, rather that to vertical interconnect X1. Continuing this process, it can be seen that the X value and the Y value have different endian formats, such that X0=Y15, X1=Y14, . . . , X15=Y0.

In the exemplary embodiment described above, bit swap device 300 reverses the order of all of the N-bits in the X value and Y value. More generally speaking, however, bit swap device 300 may re-order bits according to any selected algorithm. For instance, in the example above, bit swap device 300 may instead be configured to swap the most significant byte (MSB) and least significant byte (LSB) in the 16-bit X and Y values, while preserving order within each byte. Thus, the initial ordering may be as follows:

$LSB=X0=Y0, X1=Y1, \ldots, X7=Y7;$ and $MSB=X8=Y8, X9=Y9, \ldots, X15=Y5.$

However, after bit swap device 300 re-orders the bits, the final ordering may be as follows:

$LSB=X0=Y8, X1=Y9, \ldots, X7=Y15;$ and $MSB=X8=Y0, X9=Y1, \ldots, X15=Y7.$

Another way to improve the computational capability of the programmable interconnects in an FPGA is to increase the signal aggregation ability. For instance, if a number of CLBs are able to transmit data over the same wiring, there is a corresponding reduction in the required routing complexity of the FPGA. Examples of logical functions that benefit from this type of improvement are Logic 1 detectors and Logic 0 detectors. These functions are used to detect at least one Logic 1 value or all Logic 0 values in a set of data bits. More complex functions like overflow detection and threshold detection rely on these more basic functions. Implementing a conventional Logic 1 detector or Logic 0 detector in a FPGA consumes a fair amount of CLB resources. However, an FPGA that implements logical functions using the programmable interconnects in accordance with the principles of the present invention eases these requirements.

Figure 4:
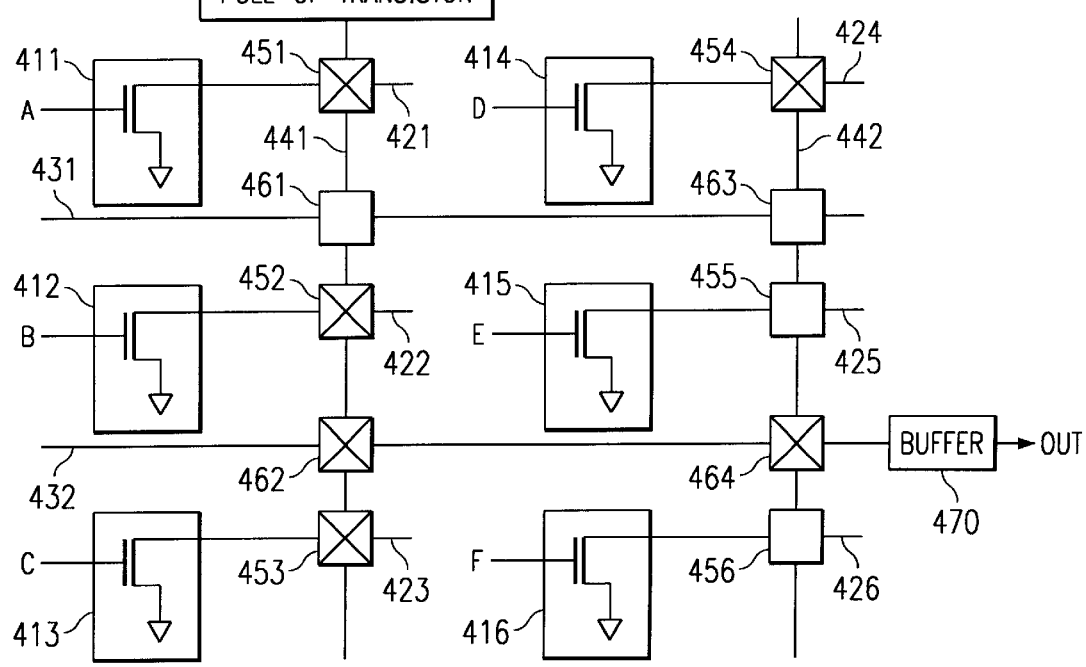
FIG. 4 illustrates an exemplary Boolean logic gate in the embedded FPGA implemented with programmable interconnects according to one embodiment of the present invention.

FIG. 4 illustrates exemplary Boolean logic gate 400 in FPGA 115 implemented with programmable interconnects according to one embodiment of the present invention. Boolean logic gate 400 comprises transistors 411–416, output interconnects 421–426, horizontal interconnects 431 and 432, vertical interconnects 441 and 442, interconnect switches 451–456, interconnect switches 461–464, buffer 470, and pull-up transistor 480. As will be explained below in greater detail, Boolean logic gate 400 may function as a wired OR gate or a wired NOR gate, depending on whether buffer 470 is an inverting buffer or a non-inverting buffer. Boolean logic gate 400 may be used to detect the presence of at least one Logic 1 value and to detect the presence of all Logic 0 values.

Transistors 411–416 are N-type transistors that may comprise the output drive transistors in configurable logic blocks, programmable logic devices, or simple logic gates in FPGA 115. The outputs of transistors 411–416 are the output interconnects 421–426, respectively. Output interconnects 421–423 may be coupled to vertical interconnect 441 by interconnect switches 451–453, respectively. Output interconnects 424–426 may be coupled to vertical interconnect 442 by interconnect switches 454–456, respectively.

Vertical interconnect 441 may be coupled to horizontal interconnects 431 and 432 by interconnect switches 461 and 462, respectively. Vertical interconnect 442 may be coupled to horizontal interconnects 431 and 432 by interconnect switches 463 and 464, respectively. In FIG. 4, closed interconnect switches are shown as a square with an X therein and open interconnect switches are shown as an empty square. Thus, interconnect switches 451–454 and interconnect switches 462 and 464 are closed and interconnect switches 455, 456, 461 and 463 are open.

In effect, the outputs of transistors 411–414 are shorted to each other and are connected to pull-up transistor 480. This forms a wired-OR gate. The gates of transistors 411–416 are the signals A, B, C, D, E and F. The outputs of transistors 415 and 416 are not used (i.e., open-circuited). Thus, the input of buffer 470 is the OR result of A, B, C and D. If buffer 470 is non-inverting, the OUT signal is equal to the OR result of A, B, C and D (i.e., A OR B OR C OR D). If buffer 470 is inverting, the OUT signal is equal to the NOR result of A, B, C and D.

Advantageously, the interconnect switches may be reset to give different OR and NOR results. For example, if interconnect switches 453 and 454 are opened and interconnect switches 455 and 456 are closed, the input of buffer 470 is the OR result of A, B, E and F. Similarly, buffer 470 may be reset to switch between an OR result (non-inverting) and a NOR result (inverting).

Although the present invention has been described in detail, those skilled in the art should understand that they can make various changes, substitutions and alterations herein without departing from the spirit and scope of the invention in its broadest form.

What is claimed is:

1. A field programmable gate array comprising:
   a plurality of configurable logic blocks (CLBs);
   a plurality of interconnects;
   a plurality of interconnect switches capable of coupling ones of said plurality of interconnects to each other and to inputs and outputs of said plurality of configurable logic blocks; and
   an interconnect switch controller capable of controlling said plurality of interconnect switches, wherein said interconnect switch controller in a first switch configuration causes a first interconnect to be coupled to an output of a first CLB, causes a second interconnect to be coupled to an output of a second CLB, causes said first and second interconnects to be coupled to a third interconnect, and causes said third interconnect to be coupled to a pull-up device coupled to a power supply source of said field programmable gate array, said first, second and third interconnects and said pull-up device thereby forming a two-input NOR gate.

2. The field programmable gate array as set forth in claim 1 wherein said interconnect switch controller comprises a memory capable of storing said first switch configuration.

3. The field programmable gate array as set forth in claim 2 wherein said memory comprises a static read only memory.

4. The field programmable gate array as set forth in claim 3 wherein said interconnect switch controller comprises at least one configurable logic block in said field programmable gate array.

5. The field programmable gate array as set forth in claim 1 wherein said pull-up device is a pull-up transistor.

6. The field programmable gate array as set forth in claim 1 further comprising a buffer having an input coupled to said third interconnect and an output coupled to an input of a third CLB.

7. The field programmable gate array as set forth in claim 6 wherein said buffer is a non-inverting line driver.

8. The field programmable gate array as set forth in claim 6 wherein said buffer is an inverting line driver, said first, second and third interconnects, said pull-up device, and said buffer thereby forming a two-input OR gate.

9. A system-on-a-chip integrated circuit comprising:
   a main memory for storing main program instructions;
   a processing circuit capable of executing said main program instructions;
   a plurality of embedded circuit components; and
   a field programmable gate array comprising:
      a plurality of configurable logic blocks (CLBs);
      a plurality of interconnects;
      a plurality of interconnect switches capable of coupling ones of said plurality of interconnects to each other and to inputs and outputs of said plurality of configurable logic blocks; and
      an interconnect switch controller capable of controlling said plurality of interconnect switches, wherein said interconnect switch controller in a first switch configuration causes a first interconnect to be coupled to an output of a first CLB, causes a second interconnect to be coupled to an output of a second CLB, causes said first and second interconnects to be coupled to a third interconnect, and causes said third interconnect to be coupled to a pull-up device coupled to a power supply source of said field programmable gate array, said first, second and third interconnects and said pull-up device thereby forming a two-input NOR gate.

10. The system-on-a-chip integrated circuit as set forth in claim 9 wherein said interconnect switch controller comprises a memory capable of storing said first switch configuration.

11. The system-on-a-chip integrated circuit as set forth in claim 10 wherein said memory comprises a static read only memory.

12. The system-on-a-chip integrated circuit as set forth in claim 11 wherein said interconnect switch controller comprises at least one configurable logic block in said field programmable gate array.

13. The system-on-a-chip integrated circuit as set forth in claim 9 wherein said pull-up device is a pull-up transistor.

14. The system-on-a-chip integrated circuit as set forth in claim 9 further comprising a buffer having an input coupled to said third interconnect and an output coupled to an input of a third CLB.

15. The system-on-a-chip integrated circuit as set forth in claim 14 wherein said buffer is a non-inverting line driver.

16. The system-on-a-chip integrated circuit as set forth in claim 14 wherein said buffer is an inverting line driver, said first, second and third interconnects, said pull-up device, and said buffer thereby forming a two-input OR gate.

17. A field programmable gate array comprising:
   a plurality of configurable logic blocks (CLBs);
   a plurality of interconnects;
   a plurality of interconnect switches capable of coupling ones of said plurality of interconnects to each other and to inputs and outputs of said plurality of configurable logic blocks; and
   an interconnect switch controller capable of controlling said plurality of interconnect switches, wherein said interconnect switch controller in a first switch configuration couples N interconnects between N CLB outputs and a common interconnect, each of said N interconnects being coupled between one CLB output and said common interconnect, and wherein said interconnect switch controller couples said common interconnect to a pull-up device coupled to a power supply source of said field programmable gate array, said N interconnects, said common interconnect, and said pull-up device thereby forming an N-input NOR gate.

18. The field programmable gate array as set forth in claim 17 wherein said interconnect switch controller comprises a memory capable of storing said first switch configuration.

19. The field programmable gate array as set forth in claim 18 wherein said memory comprises a static read only memory.

20. The field programmable gate array as set forth in claim 17 wherein said interconnect switch controller comprises at least one configurable logic block in said field programmable gate array.

21. The field programmable gate array as set forth in claim 17 wherein said pull-up device is a pull-up transistor.

22. The field programmable gate array as set forth in claim 17 further comprising a buffer having an input coupled to said common interconnect and an output coupled to an input of a CLB.

23. The field programmable gate array as set forth in claim 22 wherein said buffer is a non-inverting line driver.

24. The field programmable gate array as set forth in claim 23 wherein said buffer is an inverting line driver, said N interconnects, said common interconnect, said pull-up device, and said buffer thereby forming an N-input OR gate.

25. The field programmable gate array comprising:
   a plurality of configurable logic blocks (CLBs);
   a plurality of interconnects;
   a plurality of interconnect switches capable of coupling ones of said plurality of interconnects to each other and to inputs of said plurality of configurable logic blocks; and
   an interconnect switch controller capable of controlling said plurality of interconnect switches, wherein said interconnect switch controller in a first switch configuration causes a first interconnect to be coupled to an output of a first CLB, causes a second interconnect to be coupled to an output of a second CLB, causes said first and second interconnects to be coupled to a third interconnect, and causes said third interconnect to be coupled to a pull-up device coupled to a power supply source of said field programmable gate array, said first, second and third interconnects and said pull-up device thereby forming a logic state.

26. The field programmable gate array as set forth in claim 25 wherein said interconnect switch controller comprises a memory capable of storing said first switch configuration.

27. The field programmable gate array as set forth in claim 26 wherein said memory comprises a static read only memory.

28. The field programmable gate array as set forth in claim 27 wherein said interconnect switch controller comprises at least one configurable logic block in said field programmable gate array.

29. The field programmable gate array as set forth in claim 25 wherein said pull-up device is a pull-up transistor.

30. The field programmable gate array as set forth in claim 25 further comprising a buffer having an input coupled to said third interconnect and an output coupled to an input of a third CLB.

31. The field programmable gate array as set forth in claim 30 wherein said buffer is a non-inverting line driver.

32. The field programmable gate array as set forth in claim 30 wherein saif first, second and third interconnects, said pull-up device, and said buffer form a two-input NOR gate.

33. The field programmable gate array as set forth in claim 30 wherein said buffer in an inverting line driver, said first, second and third interconnects, said pull-up device, and said buffer thereby forming a two-input OR gate.

34. A system-on-a-chip integrated circuit comprising:
a main memory for storing mean program instructions;
a processing circuit capable of executing said main program instructions;
a plurality of embedded circuit components; and
a field programmable gate array comprising:
a plurality of configurable logic blocks (CLBs);
a plurality of interconnects;
a plurality of interconnect switches capable of coupling ones of said plurality of interconnects to each other and to inputs and outputs of said plurality of configurable logic blocks; and
an interconnect switch controller capable of controlling said plurality of interconnect switches, wherein said interconnect switch controller in a first switch configuration causes a first interconnect to be couple to an output of a first and second interconnects to be coupled to a third interconnect, and causes said third interconnect to be coupled to a pull-up device coupled to a power of said field programmable gate array, said first, second and third interconnects and said pull-up device thereby forming a logic gate.

35. The system-on-a-chip integrated circuit as set forth in claim 34 wherein said interconnect switch controller comprises a memory capable of storing said first switch configuration.

36. The system-on-a-chip integrated circuit as set forth in claim 35 wherein said memory comprises a static read only memory.

37. The system-on-a-chip integrated circuit as set forth in claim 36 wherein said interconnect switch controller comprises at least one configurable logic block in said field programmable gate array.

38. The system-on-a-chip integrated circuit as set forth in claim 34 wherein said pull-up device is a pull-up transistor.

39. The system-on-a-chip integrated circuit as set forth in claim 34 further comprising a buffer having an input coupled to said third interconnect and an output coupled to an input of a third CLB.

40. The system-on-a-chip integrated circuit as set forth in claim 39 wherein said buffer is a non-inverting line driver.

41. The system-on-a-chip integrated circuit as set forth in claim 40 wherein said first, second and third interconnects, said pull-up device, and said buffer from a two-input NOR gate.

42. The system-on-a-chip integrated circuit as set forth in claim 39 wherein said buffer is an inverting line driver, said first, second and third interconnects, said pull-up device, and said buffer thereby forming a two-input OR gate.

43. A field programmable gate array comprising:
a plurality of configurable logic blocks )CLBs);
a plurality of interconnects;
a plurality of interconnect switches capable of coupling ones of said plurality of interconnects to each other and to inputs and outputs of said plurality of configurable logic blocks; and
an interconnect switch controller capable of controlling said plurality of interconnect switches, wherein said interconnect switch controller in a first switch configuration couples N interconnects between N CLB outputs and a common interconnect, each of said N interconnects being coupled between one CLB output and said common interconnect, and wherein said interconnect switch controller couples said common interconnect to a pull-up device coupled to a power supply source of said field programmable gate array, said N interconnects, said common interconnect, and said pull-up device thereby forming a logic gate.

44. The field programmable gate array as set forth in claim 43 wherein said interconnect switch controller comprises a memory capable of storing said first switch configuration.

45. The field programmable gate array as set forth in claim 44 wherein said memory comprises a static read only memory.

46. The field programmable gate array as set forth in claim 43 wherein said interconnect switch controller comprises at least one configurable logic block in said field programmable gate array.

47. The field programmable gate array as set forth in claim 43 wherein said pull-up device is a pull-up transistor.

48. The field programmable gate array as set forth in claim 43 further comprising a buffer having an input coupled to said common interconnect and an output coupled to an input of a CLB.

49. The field programmable gate array as set forth in claim 48 wherein said buffer is a non-inverting line driver.

50. The field programmable gate array as set forth in claim 49 wherein said N interconnects, said common interconnect, said pull-up device, and said buffer from an N-input NOR gate.

51. The field programmable gate array as set forth in claim 48 wherein said buffer is an inverting line driver, said N-interconnects, said common interconnect, said pull-up device, and said buffer thereby forming an N-input OR gate.

* * * * *